United States Patent
Kajiyama

[11] Patent Number: 5,982,008
[45] Date of Patent: Nov. 9, 1999

[54] SEMICONDUCTOR DEVICE USING A SHALLOW TRENCH ISOLATION

[75] Inventor: Takeshi Kajiyama, Yokohama, Japan

[73] Assignee: Kabushiki Kaisha Toshiba, Kawasaki, Japan

[21] Appl. No.: 08/916,428

[22] Filed: Aug. 22, 1997

[30] Foreign Application Priority Data

Aug. 23, 1996 [JP] Japan ................................ 8-222793

[51] Int. Cl.⁶ .................................................. H01L 29/76
[52] U.S. Cl. ........................... 257/401; 257/296; 257/510
[58] Field of Search .................................. 257/296, 301, 257/303, 306, 401, 905, 907, 510, 513, 516, 397; 438/296, 253, 424; 430/5, 313, 314

[56] References Cited

U.S. PATENT DOCUMENTS

| | | | |
|---|---|---|---|
| 5,378,906 | 1/1995 | Lee | 257/905 |
| 5,539,229 | 7/1996 | Noble, Jr. et al. | 257/301 |
| 5,567,553 | 10/1996 | Hsu et al. | 430/5 |
| 5,702,976 | 12/1997 | Shuegraf et al. | 438/424 |
| 5,732,009 | 3/1998 | Tadaki et al. | 257/296 |
| 5,741,738 | 4/1998 | Mandelman et al. | 438/296 |
| 5,798,544 | 8/1998 | Ohya et al. | 257/296 |

OTHER PUBLICATIONS

IEEE Transactions on Electron Devices, vol. 36, No. 9 Sep. 1989. Effects of a New Trench–Isolated Trasistor Using Sidewall Gates. Kazumasa Hieda et al.

Primary Examiner—Sara Crane
Attorney, Agent, or Firm—Oblon, Spivak, McClelland, Maier & Neustadt, P.C.

[57] ABSTRACT

In a MOS transistor using shallow trench isolation, a patten of an element formation region has a shape of a modified hexagon in which a hexagon is compressed into a shape like a rhombus in a direction perpendicular to an extension direction of a gate electrode wiring. The pattern of element formation region is constructed as described above, so that an element formation region is formed in a lager current path in a corner device. Thus, a lowering of a threshold voltage (a short channel effect) due to the corner device can be restricted without increasing a width of the gate electrode wiring.

15 Claims, 6 Drawing Sheets

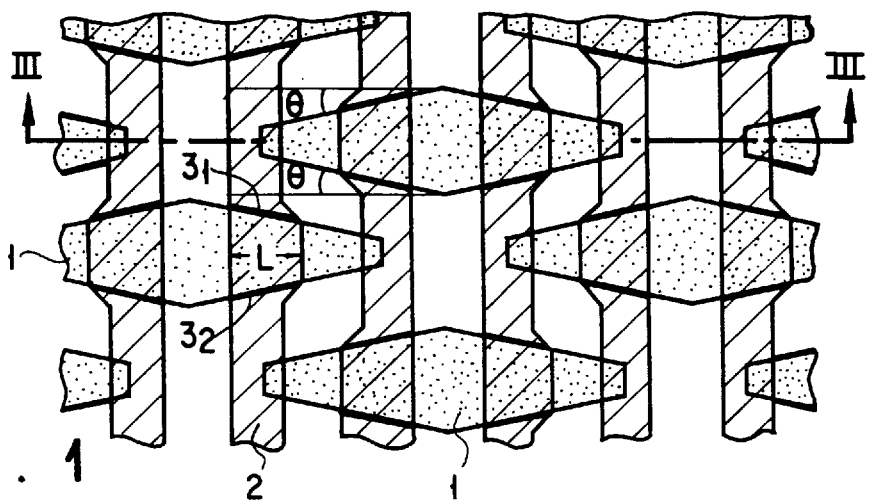
F I G. 1
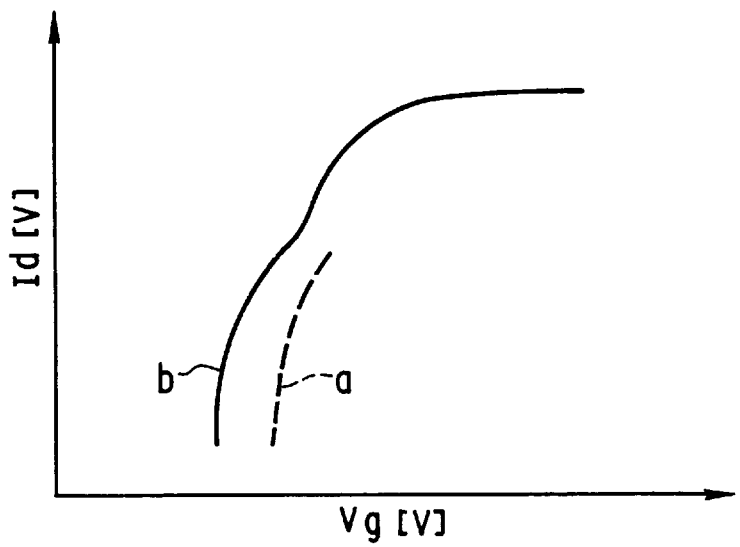
F I G. 2
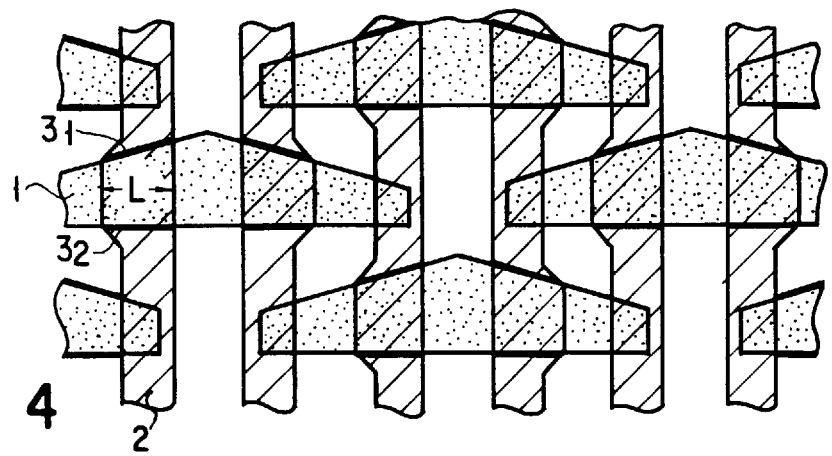
F I G. 4

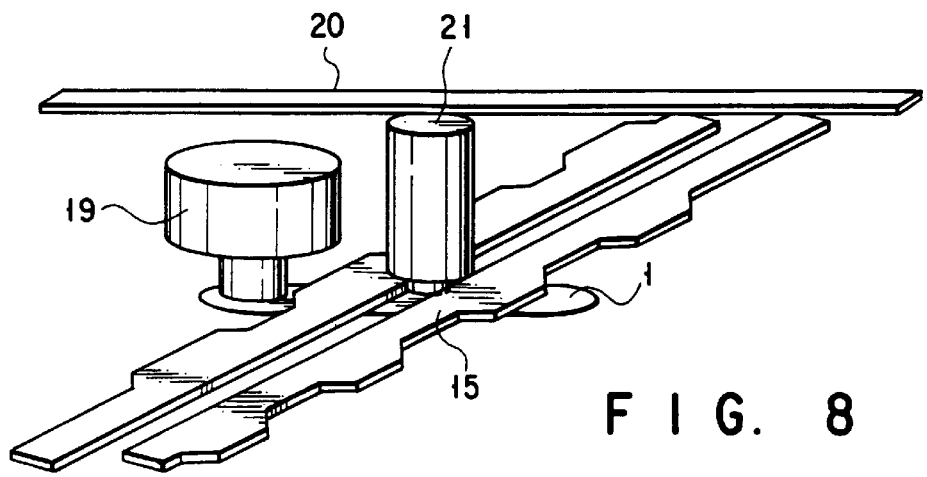
F I G. 8
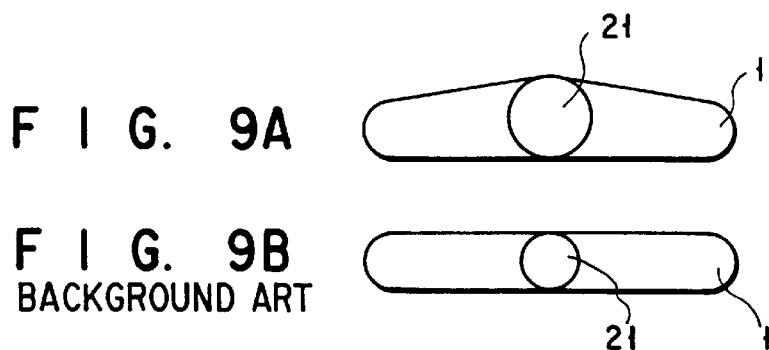
F I G. 9A
F I G. 9B
BACKGROUND ART
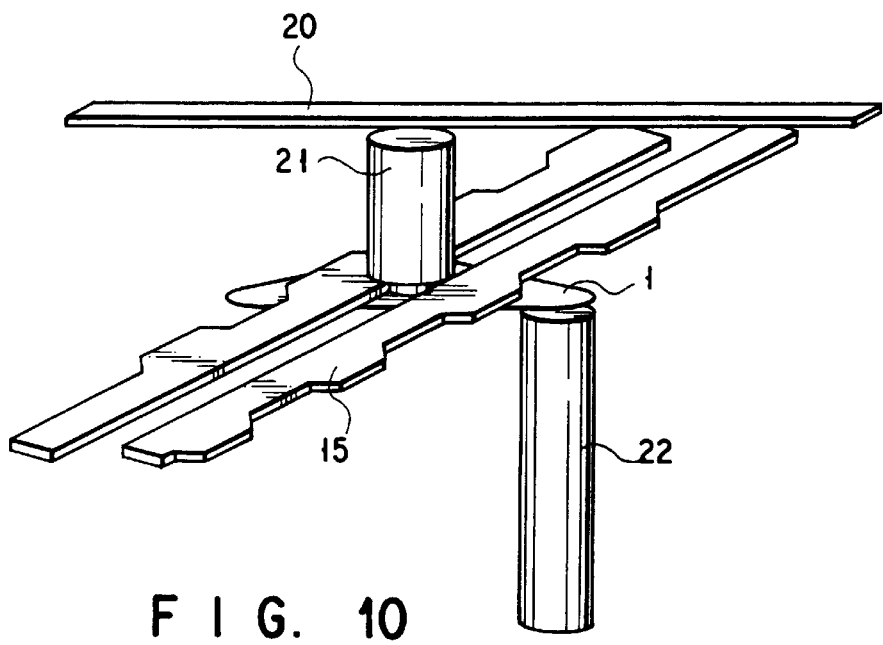
F I G. 10

SEMICONDUCTOR DEVICE USING A SHALLOW TRENCH ISOLATION

BACKGROUND OF THE INVENTION

1. Field of the Invention

The present invention relates to a semiconductor device using shallow trench isolation technology.

2. Discussion of the Background

In recent years, a large scale integrated circuit (LSI) has been widely used in computers, communication systems and other electronic devices. The large scale integrated circuit includes a semiconductor chip in which a great number of transistors, resistors and other electrical components are formed and connected together so as to realize electric circuits in a semiconductor chip. This means that the performance of these electronic devices is greatly dependent upon the performance of the LSI. The performance of the LSI can be improved by achieving a scale down of the devices to realize high integration thereof.

Conventionally, an element isolation has been achieved by a LOCOS (local oxidation of silicon) technology. In the element isolation by the LOCOS separation, an encroachment of an oxide film called a "bird's beak" is formed in element formation regions, and thus effective areas in the element formation regions are reduced. Therefore, the element isolation by the LOCOS separation is not effective in high integration.

Recently, in consideration of such circumstances, an element isolation by a STI (Shallow Trench Isolation) technology has been frequently used. According to the STI technology, a shallow trench for element isolation is formed in a surface region of a semiconductor substrate, and the shallow trench is filled with an isolation film.

This technology of element isolation differs from the LOCOS separation in that the "bird's beak" is not generated. This serves to prevent element formation regions from being reduced. Moreover, the STI technology has an element isolation performance superior to that of the LOCOS separation. Thus, the element isolation by the STI technology is more suitable to high integration as compared with the element isolation by the LOCOS method.

However, a semiconductor device isolated by the STI technology has the following problems.

In the element isolation process according to the STI technology, first, as shown in FIG. 11A, a shallow trench 92 is formed in a surface region of a semiconductor substrate 91 on which a gate insulation film 94 is formed. Subsequently, an isolation film 93 is formed over the surface region of the semiconductor substrate with such a thickness that the element isolation trench 92 is sufficiently filled with the isolation film 93.

Next, the isolation film 93 thus formed is etched back to the surface of the semiconductor substrate by means of a CMP (Chemical and Mechanical Polishing) method, an isotropic etching, etc., so that the isolation film 93 formed on the substrate region except in the element isolation trench 92 is removed. As a result, the isolation film 93 remains only in the trench 92.

When the isolation film 93 is removed by means of etching, the isolation film 93 is subjected to over-etching to prevent the isolation film 93 from remaining on an element formation region surface (active layer surface). As a result, as shown in FIG. 11B, an upper portion of a side surface of the trench 92, i.e., an upper portion of the semiconductor substrate region configuring the trench 92, is exposed. The semiconductor substrate portion exposed at the upper portion of the side surface of the trench 92 is referred to hereinafter as an exposed trench portion.

The over-etching of the isolation film 93 has a further disadvantage that the element formation region surface (active layer surface) is also etched together with the isolation film 93, giving damage to the element formation region surface. In order to prevent such a disadvantage from occurring, the CMP method may be employed.

Specifically, a stopper film (not shown) is formed over the substrate surface on which the gate insulation film 94 is already formed, and thereafter, the element isolation trench 92 is formed. Subsequently, an isolation film 93 is formed over the substrate surface, and thereafter, the isolation film 93 is etched back to the stopper film by the CMP method. Next, the stopper film is removed. As a result, a stepped convex portion of the gate insulation film 94 is formed on the substrate surface. Then, the convex portion of the gate insulation film 94 is removed by etching to achieve planarization of the substrate surface.

In this case, however, it is difficult to attain uniform etching to the convex portion of the isolation film 93 over the substrate surface. Since this etching is generally attained by hydrofluoric acid isotropic etching, an exposed trench portion as shown in FIG. 11B is generated.

In this state, if an electrode, a wiring or a conductive component constituted of an electrode and a wiring (referred hereinafter to as an electrode wiring 95) is formed on the element formation region and the element isolation region, the exposed trench portion comes into contact with the electrode wiring 95, as shown in FIG. 11C. As a consequence, when a voltage is applied to the electrode wiring 95, a horizontally directed electric field E is generated with respect to the substrate surface, as shown in FIG. 11C. The generation of the electric field E affects the elements formed in the element formation regions, degrading the performance of the device. Basically, the electric field E should not be generated.

As an example, when a MOS transistor is formed in the element formation region, the electrode wiring 95 includes a gate electrode, a gate wiring or a conductive element constituted of the gate electrode and the gate wiring (referred to hereinafter as a gate electrode wiring), and the following problem arises.

FIG. 12 shows a plan pattern view of a background MOS transistor which is isolated by the STI separation. In FIG. 12, reference numeral 97 denotes element formation regions, and the remaining regions show element isolation regions which are isolated by the STI separation. That is, the element formation regions 97 are surrounded by shallow trenches for element isolation.

When a voltage is applied to the gate electrode wiring 95, not only is a vertically directed electric field generated, but a horizontally directed electric field is also generated by the voltage applied to the gate electrode wiring 95, in a semiconductor substrate portion of the element formation region in the vicinity of a contact portion 96 of the exposed trench portion and the gate electrode wiring 95. Such a semiconductor substrate portion of the element formation region, in which not only the vertically directed electric fields but also a different-way directed electric field are generated, is referred to hereinafter as a corner device.

As described above, since in the corner device not one-dimensional but two-dimensional electric fields are generated, a short channel effect easily occurs in a case in which a gate electrode width becomes small due to a scale down.

This means that a short channel effect is greater than in a case in which the exposed trench portion is not provided. In other words, it means that it is difficult to achieve high integration of the semiconductor elements due to a strong short channel effect, although it is possible to prevent spaces of the element formation region from being reduced with the use of STI technology.

For performing an experimental test, MOS transistors are formed in the element formation regions of a semiconductor substrate, the element separation region being isolated according to the background STI or LOCOS separation. FIG. 13 shows Vg-Id characteristic curves of the MOS transistor, obtained by the test results.

In FIG. 13, reference character "a" indicates a Vg-Id characteristic curve of a MOS transistor using the STI separation in which a short channel effect is not generated, reference character "b" indicates a Vg-Id characteristic curve of a MOS transistor using the STI separation in which the short channel effect is generated, and reference numeral "c" indicates a Vg-Id characteristic curve of a MOS transistor using the LOCOS separation in which a short channel effect is not generated. In FIG. 13, the ordinate (Id) is a logarithm scale.

In FIG. 13, when the drain currents Id of these MOS transistors are compared with each other with regard to a gate voltage Vg, it can be seen that the MOS transistors using the STI separation (whose characteristic curves are shown by reference numerals "a" and "b") have drain currents Id larger than the MOS transistors using the LOCOS separation (whose characteristic curves are shown by reference character "c"). This indicates that a threshold voltage shifts to a low level side due to a strong short channel effect in the MOS transistor using the STI separation.

To solve the above mentioned problem, there is proposed a method in which the width of the gate electrode wiring 95 is made large to lengthen the channel length. However, such a method not only hinders a scale down of devices but also lowers effects obtained from the use of the STI separation in place of the use of the LOCOS separation.

The problems as described above apply to a case (FIGS. 11B and 11C) in which the upper surface of the isolation film 93 filled in the element isolation trench 92 is flat, as well as a case (FIG. 14) in which the upper surface of the isolation film 93 is concaved along a circumference of a side wall on an upper portion of the element isolation trench 92.

Moreover, the STI separation differs from the LOCOS separation in that there is no reduction in space of the element formation region. However, the width of the element formation region becomes small accompanying with the progress of scale down. Accordingly, there has arisen a problem that it is difficult to make a contact to the element formation region.

SUMMARY OF THE INVENTION

The present invention has been made in view of the above circumstances. An object of the present invention is to provide a novel semiconductor device which uses a shallow trench isolation capable of readily achieving high integration of MOS transistors.

To achieve the above object, the present invention provides a semiconductor device which includes an element isolation region having a trench which is formed in a surface region of a semiconductor substrate, and in which an isolation film is formed. Element formation regions are isolated from each other by the element isolation, the element formation regions having an active region of a MOS transistor. Further, the active region has a current path longer than a shortest distance between a source diffusion layer and a drain diffusion layer of the MOS transistor, in a portion of the active region which is adjacent to an interface between the active region and the element isolation region, and on which a gate electrode wiring is formed. In this case, the current path preferably uses the longest current path.

The foregoing semiconductor device may include various preferred embodiments. More specifically, the gate electrode wiring may be extended over the active region to cross two peripheral edge portions of the active region, and the active region in which the current path is provided corresponds to at least one of two peripheral edge portions. There may be a portion of the semiconductor substrate, which is at the side wall of the trench and is not covered with the isolation film to form an exposed trench portion, and a gate electrode wiring may be formed on the exposed trench portion. The active region and the gate electrode wiring may obliquely cross each other. The active region may also have a rectangular shape.

The longer current path may be in a shape of a curved line. The element formation region may have a formation region in which a stacked capacitor is formed, and in which a capacitor electrode is connected to one of the source diffusion layer and the drain diffusion layer of the MOS transistor. The element formation region may have a formation region in which a trench capacitor is formed, and in which a capacitor electrode is connected to one of the source diffusion layer and the drain diffusion layer of the MOS transistor. The other of the diffusion layer and the drain diffusion layer not connected to the capacitor electrode may be connected to a bit line and have a space larger than the above-mentioned one of the source diffusion layer and the drain diffusion layer connected to the capacitor electrode, when viewed from a top of the semiconductor substrate.

According to the present invention, the novel semiconductor device may have a construction in which there is a presence of a current path longer than a shortest distance between source and drain layers of a MOS transistor in an active region portion which is adjacent to the trench. The construction as described above makes it possible to form an element formation region having a wider portion than the element formation region in a background semiconductor device in which a width of an active region portion provided with the gate electrode wiring is fixed. Therefore, even if the scale down of the device progresses, when making a contact with the element formation region or the gate electrode wiring provided thereon is needed, the contact may be made on the wider portion. This serves to readily achieve high integration of a MOS transistor.

According to the present invention, moreover, the gate electrode wiring may be formed on the exposed trench portion which is not covered by an isolation film at a side wall of the trench, so that a two-dimensional electric field is generated in an active region portion adjacent to the exposed trench portion. Namely, a two-dimensional electric field is generated in the active region portion, as in a case of a short channel MOS transistor. In a case of the short channel MOS transistor, a short channel effect (lowering of threshold voltage) is caused due to the generation of a two-dimensional electric field; however, in the present invention, a current path in the active region portion adjacent to the substrate exposed portion becomes the longest current path, so that lowering of the threshold voltage can be restricted.

In other words, in the present invention the lowering of a threshold voltage resulting from a corner device can be prevented without increasing a width of a gate electrode wiring. The reason why the lowering of threshold voltage is restricted is that the threshold voltage is in inverse proportion to the channel length in the case in which a two-dimensional electric field is generated. Accordingly, in the present invention, even when the gate electrode wiring is formed on the exposed trench portion which is not covered by an isolation film at the side wall of the trench, the lowering of threshold voltage (a short channel effect) can be restricted without increasing the width of the gate electrode wiring. Therefore, high integration of a MOS transistor can be readily achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention, in which:

FIG. 1 is a plan pattern view of a semiconductor device according to a first embodiment of the present invention;

FIG. 2 shows Vg-Id characteristic curves of a MOS transistor shown in FIG. 1 and a background MOS transistor shown in FIG. 12;

FIG. 4 is a plan pattern view of a semiconductor device according to a second embodiment of the present invention;

FIG. 8 is a perspective view of a semiconductor device according to a fifth embodiment of the present invention;

FIG. 9A is a plan pattern view of part of the semiconductor device shown in FIG. 8, used for explaining the effect according to the fifth embodiment;

FIG. 9B is a plan pattern view showing part of the background semiconductor device corresponding to the semiconductor device shown in FIG. 8, the part corresponding to that shown in FIG. 9A;

FIG. 10 is a perspective view of a semiconductor device according to a sixth embodiment of the present invention:

DETAILED DESCRIPTION OF THE PREFERRED EMBODIMENTS

Figure 3A:
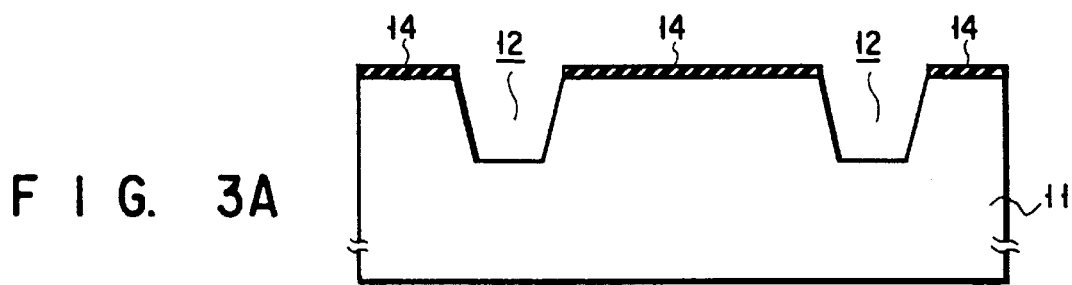
FIG. 3A to 3D are cross sectional views of device structures in forming processes, used for explaining a manufacturing method of the MOS transistor shown in FIG. 1.

Embodiments of the present invention will be described below with reference to the accompanied drawings, wherein like reference numerals designate identical or corresponding parts.

FIG. 1 is a plan pattern view of a semiconductor device according to a first embodiment of the present invention, in which two MOS transistors are connected in series to each other.

In FIG. 1, reference character 1 denotes an element formation region of a MOS transistor; and on the other hand, a remaining region thereof denotes an element isolation region isolated by the STI separation technology. The element isolation region has an exposed trench portion as shown in FIG. 3B. According to this embodiment, only MOS transistors are formed in the element formation region 1. Thus, the element formation region 1 may correspond to an active region of the MOS transistors.

Figure 12:
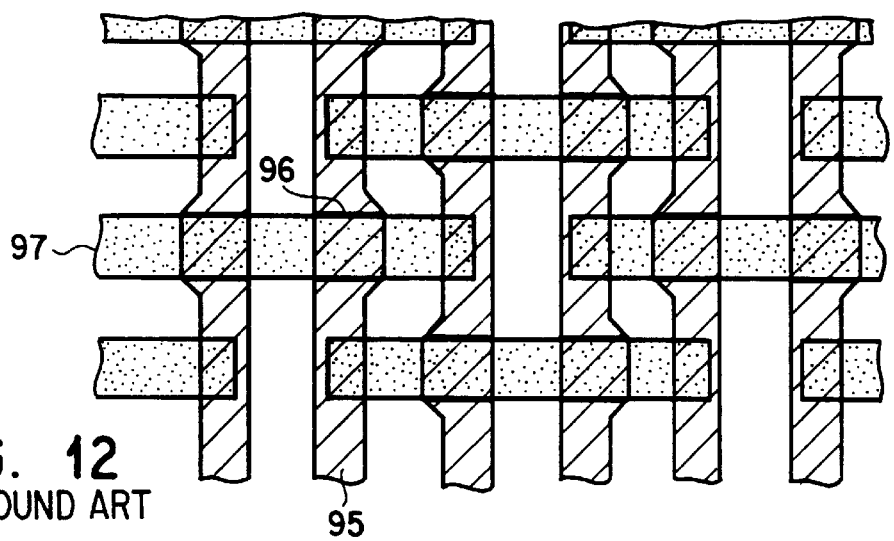
FIG. 12 is a plan pattern view of a background MOS transistor using a background STI separation.
Figure 13:
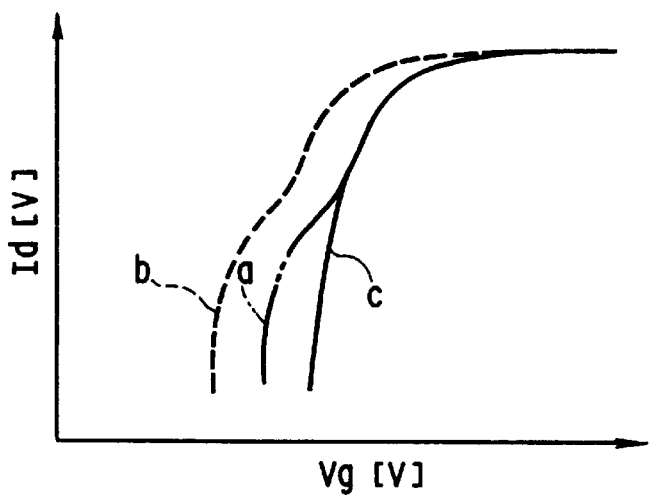
FIG. 13 shows Vg-Id characteristic curves of a background MOS transistor using a background STI separation, and a background MOS transistor using a LOCOS separation.
Figure 14:
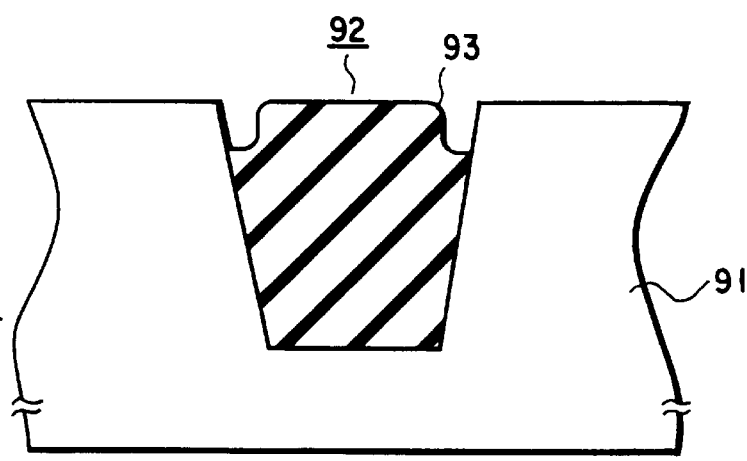
FIG. 14 is a cross sectional view of a device structure used for explaining a problem in background STI separation.

The pattern of element formation region 1 differs from the pattern 97 of the formation region of the background device shown in FIG. 12 in that it has a shape of a modified hexagon in which a hexagon is compressed into a shape like a rhombus in a longitudinal direction, that is, in an extension direction of a gate electrode wiring 2. On the other hand, the pattern of gate electrode wiring 2 is the same as the pattern 95 of the gate electrode wiring of the background device shown in FIG. 12.

As a result, in the present invention when two contact portions $3_1$, and $3_2$ of the exposed trench portions with the gate electrode wirings 2 are viewed from the top of the semiconductor substrate, extension directions of contact portions are inclined by an angle $\theta(0 <\theta<90°)$ with respect to a channel direction.

Thus, when an inversion layer (channel) is formed, longest current paths exist in paths along the contact portions $3_1$ and $3_2$, that is, in the corner devices. A length of each of the longest current paths is ($L/\cos \theta$) if the width (the shortest distance between source and drain layers) of the gate electrode wiring 2 is L. On the other hand, a length of a current path in the corner device of the background semiconductor device shown in FIG. 12 is L. Namely, the current path in the corner device of this invention embodiment is longer by $1/\cos \theta$ than that of the corner device of the background semiconductor device shown in FIG. 12. Current paths in regions other than the corner device of the semiconductor device shown in FIG. 1 have a length L, which is the same as that of the corner device of the background semiconductor device.

When the current path in the corner device becomes long in the manner as described in this embodiment, a threshold voltage in the corner device is shifted to a high level side as compared with that in the corner device of the background semiconductor device shown in FIG. 12. This is because the threshold voltage decreases in inverse proportion to the channel length when a two-dimensional electric field is generated in a channel region.

Therefore, according to this embodiment, an increase of the short channel effect resulting from the corner device can be restricted without increasing a width of a gate electrode wiring, and thus high integration of a MOS transistor can be readily achieved.

Moreover, according to this embodiment, the element formation region 1 has a compressed hexagon shape, and thus, a central portion of the element formation region 1 has a region having a width larger than a central portion of the background semiconductor device. Thus, when there is a need of making a contact with the element formation region, the contact can be gained in the wider central region. This serves to easily achieve high integration of a MOS transistor.

For example, in a case in which this embodiment is applied to a DRAM, the wider region is used as a source/drain layer region contacting a bit line, and thus contact to the bit line can be readily achieved.

FIG. 2 shows Vg-Id characteristic curves of a MOS transistor according to the first embodiment of the present invention and a background MOS transistor as shown in FIG. 12. In FIG. 2, reference character "a" indicates a Vg-Id characteristic curve of a MOS transistor according to the first embodiment of the present invention, while reference numeral "b" indicates a Vg-Id characteristic curve of a background MOS transistor shown in FIG. 12. The ordinate (Id) is shown by a logarithm scale.

When the drain currents Id are compared to each other at a gate voltage Vg in FIG. 2, it is seen that the MOS transistor of this embodiment has a characteristic that the drain current Id is small, and a threshold voltage shifts to a high level side.

As the shift in threshold voltage becomes large, the Vg-Id characteristics become hard to be under the influence of an electric field of the corner device. Then, if the shift becomes larger than the threshold voltage lowered by the influence of an electric field of the corner device, the Vg-Id characteristics become equal substantially to that in a case in which no corner device is provided.

FIGS. 3A to FIG. 3D are cross sectional views, used for explaining processes of a manufacturing method of a MOS transistor according to the embodiment. These cross sectional views each show a cross section taken along the line III—III in FIG. 1.

Figure 3B:
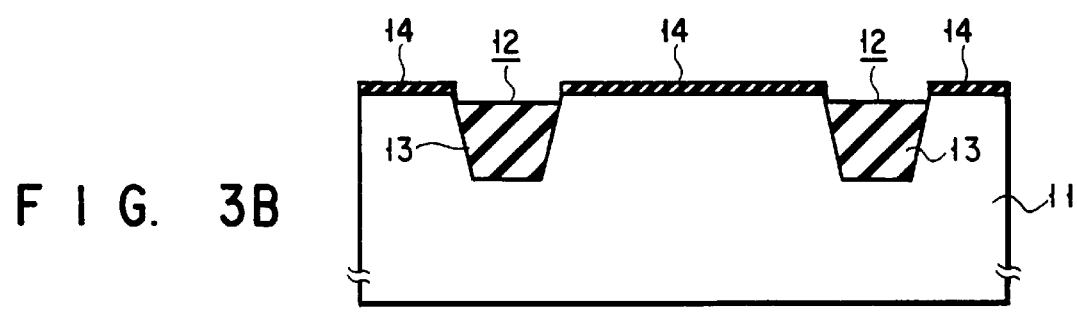

First, shallow trenches 12 for element isolation are formed in a surface region of a p-type semiconductor substrate 11 having an insulation film 14 formed thereover, as shown in FIG. 3A. Specifically, the insulation film 14 is first formed over the main surface of the p-type semiconductor substrate 11, and then a resist pattern (not shown) is formed on the insulation film 14. Using the resist pattern as a mask, the insulation film 14 and the surface region of the semiconductor substrate 11 are partially etched by an anisotropic etching method, generally an RIE method, to form the shallow trenches 12. In FIG. 3A, side walls of the element isolation trench are formed into a tapered shape; however, the side walls may be formed vertically to the substrate 11 surface.

Next, a TEOS (tetraethylorthosilicate) film 13 is formed over the substrate surface with such a thickness that the element isolation trench 12 is sufficiently filled with the TEOS material, and thereafter, the TEOS film 13 is etched back by means of a CMP method, an isotropic etching, etc. Then, the TEOS film 13 on the substrate regions except on the element isolation trenches 12 is removed so that TEOS film 13 remains only in the element isolation trench 12 as shown in FIG. 3B. In this manner, the process for the isolation by the STI separation is completed.

In this case, it is very difficult to accurately stop the removal of the TEOS film 13 just at the substrate 11 surface. Even if an etching condition is set so as to stop an etching removal at the substrate 11 surface, actually, there is the possibility that the etching will finish before the removal of the TEOS film 13 reaches the substrate 11 surface. In such a case, the TEOS film 13 remains not only in the element isolation trench 12 but also on the substrate 11 surface. In order to prevent the TEOS film 13 from remaining on the substrate 11 surface, the TEOS film 13 must be slightly over-etched. As a result, the semiconductor substrate 11 has a portion exposed at the upper side of the element isolation trench 12, as shown in FIG. 3B.

Figure 3C:
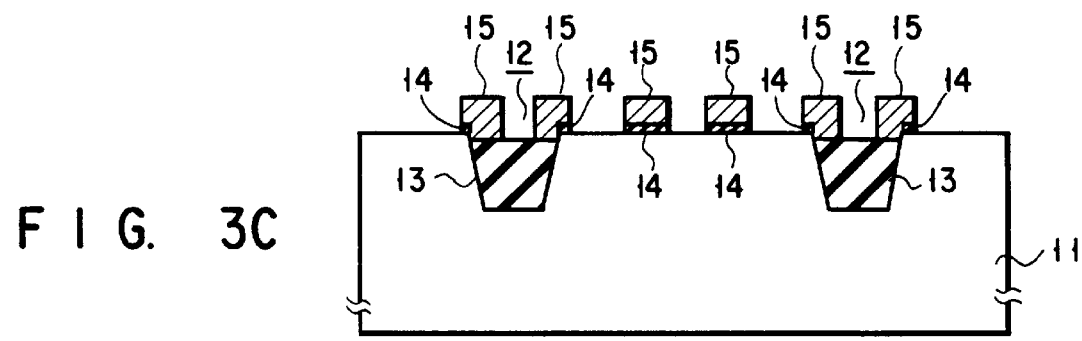

Subsequently, a conductive film which is generally a polysilicon film containing a doped impurity is formed over the substrate 11 surface. Thereafter, the conductive film and the insulation film are patterned so as to form gate insulation films 14 and gate electrode wirings 15 in each element formation region, as shown in FIG. 3C.

Figure 3D:
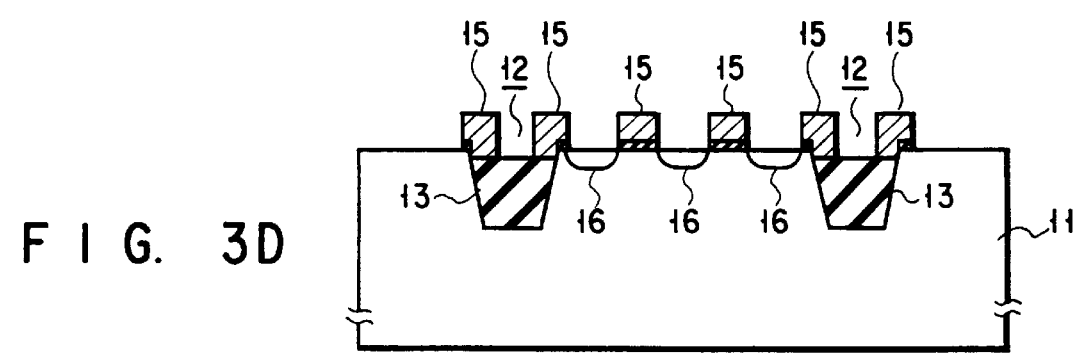

Finally, a n-type impurity ion such as phosphorus ion is implanted into the substrate surface region, using the gate electrode wiring 15 as a mask, and thereafter, the implanted n-type impurity ion is subjected to an annealing treatment so as to be activated, thus forming a source/drain diffusion layer 16, as shown in FIG. 3D. As a consequence, each element formation region is provided with two MOS transistors connected in series.

In this embodiment, three source/drain diffusion layers 16 thus formed have a same dimension as each other; however, the source/drain diffusion layer 16 situated in a center of the three source/drain diffusion layers 16 has no need of being a same dimension as source/drain diffusion layers 16 situated on its opposite sides. Also, a thin insulation film may be formed on an exposed portion of the element isolation trench 12, that is, an insulation film having such a thickness that the insulation film does not affect an influence on the element formation region by an electric field generated by a voltage applied to the gate electrode wiring 15.

FIG. 4 is a top plan view of a semiconductor device according to a second embodiment of the present invention. In FIG. 4, the same reference characters as in FIG. 1 are used to designate portions corresponding to those of the semiconductor device shown in FIG. 1, and a detailed explanation is omitted, as is also applied for other embodiments which will be described later.

The second embodiment of FIG. 4 differs from the first embodiment in that as shown in FIG. 4 the lower-side contact portion $3_2$ of two contact portions $3_1$ and $3_2$ has an inclination angle θ to the channel direction of zero, in other words, the current path in the corner device of the lower-side contact portion $3_2$ has a same length as that in the background semiconductor device.

Figure 5:
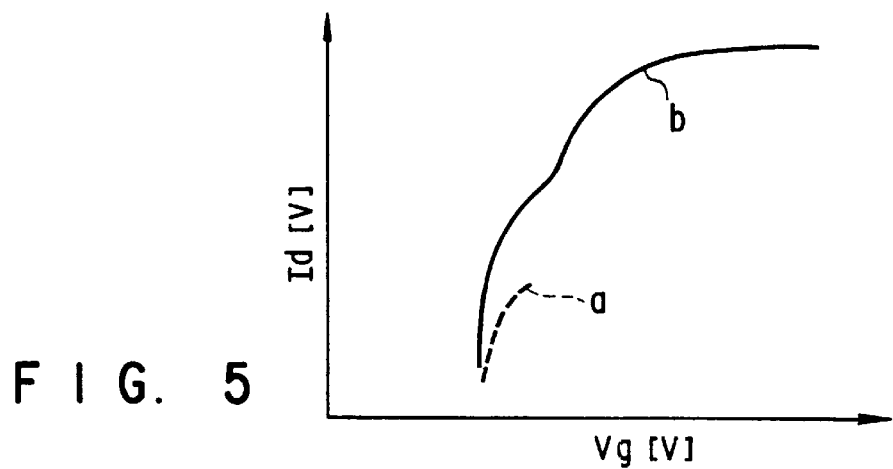
FIG. 5 shows Vg-Id characteristic curves of a MOS transistor shown in FIG. 4 and a background MOS transistor shown in FIG. 12.

FIG. 5 shows Vg-Id characteristic curves of a MOS transistor according to the second embodiment of the present invention and a background MOS transistor shown in FIG. 12. In FIG. 5, "a" indicates a Vg-Id characteristic curve of a MOS transistor according to the second embodiment of the present invention, on the other hand, "b" indicates a Vg-Id characteristic curve of a background MOS transistor shown in FIG. 12. The ordinate (Id) is a logarithm scale.

When the drain currents Id are compared with each other at a gate voltage Vg in FIG. 5, it is seen that the MOS transistor of this second embodiment has a characteristic that the drain current Id is small, and a threshold voltage shifts to a high level side.

Specifically, it can be read from the characteristic curves of FIG. 5 that even if the current path in the corner device only in the upperside contact portion $3_1$ in FIG. 4 is made long, an influence by the corner device to the threshold voltage can be effectively prevented, and the threshold voltage can be prevented from lowering.

Thus, according to this second embodiment, the threshold voltage can be prevented from lowering without increasing a width of the gate electrode wiring 2, as in the first embodiment.

Figure 6:
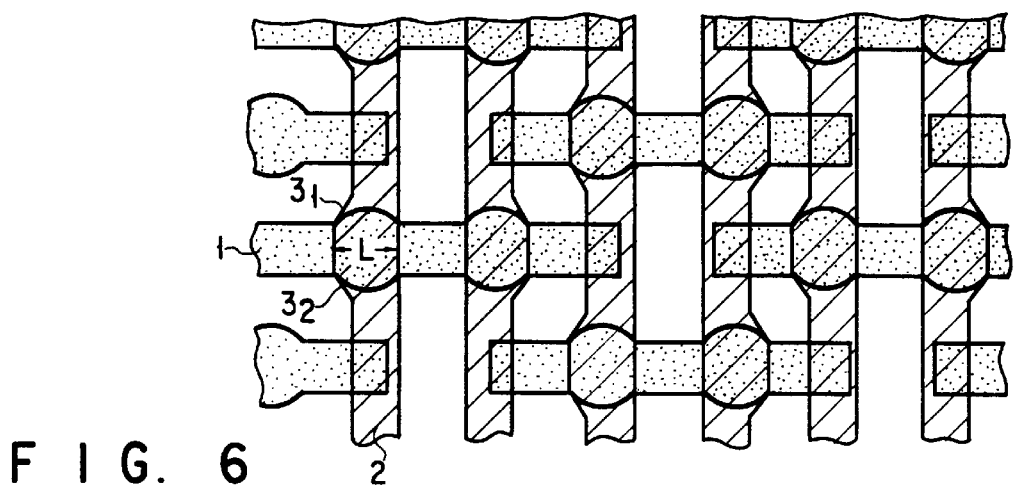
FIG. 6 is a plan pattern view of a semiconductor device according to a third embodiment of the present invention.

FIG. 6 is a top plan view of a semiconductor device according to a third embodiment of the present invention.

The third embodiment differs from the first embodiment in that two contact portions $3_1$ and $3_2$ have an arc shape when viewed from a top of the semiconductor substrate as in FIG. 6.

In this case, a current path in the corner device becomes longer than the width L of the gate electrode wiring 2, so that a short channel effect generated in the corner device can be restricted without increasing a width of the gate electrode wiring 2, as in the first embodiment.

Figure 7:
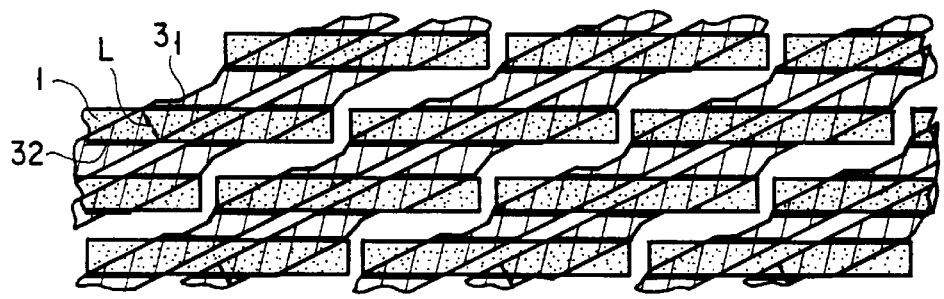
FIG. 7 is a plan pattern view of a semiconductor device according to a fourth embodiment of the present invention.
Figure 11A:
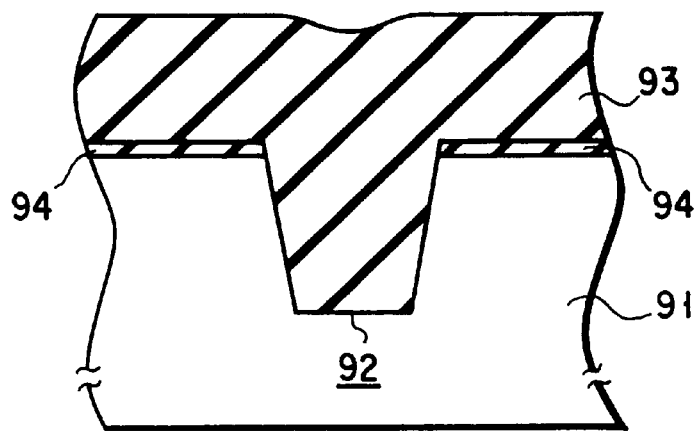
FIGS. 11A to 11C are cross sectional views of device structures of forming processes in a manufacturing method of a background semiconductor device, used for explaining a problem in an isolation according to a background STI separation.
Figure 11B:
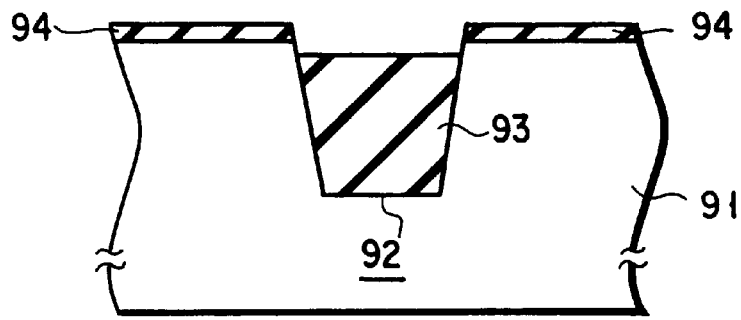
Figure 11C:
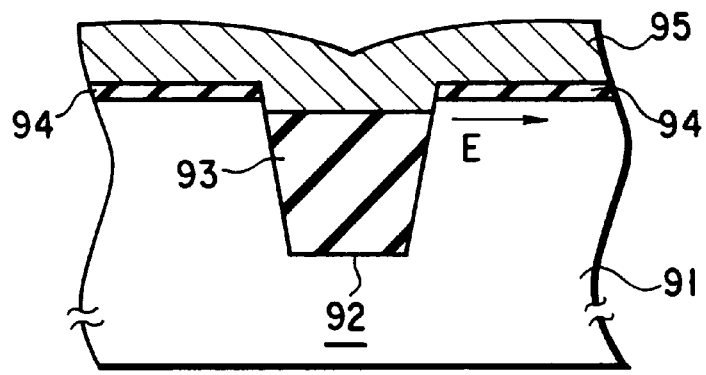

FIG. 7 is a top plan view of a semiconductor device according to a fourth embodiment of the present invention.

The fourth embodiment differs from the first embodiment in that a gate electrode wiring 2 is formed so as to cross obliquely a long side of a rectangular element formation region 1, and thus the current path in the corner device becomes longer than a width L of the gate electrode wiring 2.

Thus, according to the fourth embodiment, a current path in the corner device becomes longer than a width L of the gate electrode wiring 2, so that a short channel effect generated in the corner device can be restricted without increasing a width of the gate electrode wiring 2, as in the first embodiment.

FIG. 8 is a perspective view of a semiconductor device according to a fifth embodiment of the present invention. In FIG. 8, a gate isolation film and an interlayer isolation film are omitted for simplicity of illustration.

The fifth embodiment in FIG. 8 shows an example in which the present invention is applied to a stacked-type DRAM cell. A cylindrical stacked capacitor 19 is used as a stacked capacitor. Also, the same type transistor as shown in FIG. 4 is used as a MOS transistor.

According to the fifth embodiment, the element formation region (active layer) has a center portion having a width larger than that of the background semiconductor device. As shown in FIG. 9A, a contact area of a plug 21 with the source/drain diffusion layer for making a contact of the bit line 20 with the source/drain diffusion layer becomes larger than in the background art (FIG. 9B). This serves to achieve a reduction of contact resistance.

Moreover, according to the fifth embodiment, even if an alignment error is caused in a contact hole in the interlayered isolation film, and thus the plug 21 deviates from a predetermined position, the element formation region has a center portion having a width wider than that of the background semiconductor device, so that required contact areas can be obtained.

FIG. 10 is a perspective view of a semiconductor device according to a sixth embodiment of the present invention. In FIG. 10, a gate isolation film and an interlayered isolation film are omitted for simplicity of illustration.

The sixth embodiment in FIG. 10 shows an example in which the present invention is applied to a trench type DRAM cell. This sixth embodiment differs from the fifth embodiment in that a trench capacitor 22 is used as a capacitor, and other elements are the same as those in the fifth embodiment. Thus, this sixth embodiment can obtain effects as in the fifth embodiment.

As described above, according to the present invention, even if a scale down of a device is progressed, it is possible to readily make a contact to an element formation region and a gate electrode wiring formed thereon, so that high integration of a MOS transistor can be readily achieved.

Moreover, according to the present invention, an exposed trench portion at side walls of a trench, which is not covered with an isolation film, contacts the gate electrode wiring; however, lowering of threshold voltage (a short channel effect) is restricted without increasing a width of a gate electrode wiring. Therefore, high integration of a MOS transistor can be readily achieved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed as new and is desired to be secured by Letters Patent of the United States is:

1. A semiconductor device comprising:
    an element isolation region having a trench formed in a surface region of a semiconductor substrate, and in which an isolation film is formed;
    a gate electrode wiring; and
    element forming regions formed in the surface region of the semiconductor substrate, isolated from each other by said element isolation region, the element formation regions each having an active region of a MOS transistor on which said gate electrode wiring is provided, the active region having a pattern with a width which is increased towards the center of the active region such that both edges of a portion of the pattern on which said gate electrode wiring is formed extend outwardly towards the center of the active region, so that the active region has current paths each longer than a shortest distance between a source diffusion layer and a drain diffusion layer of the MOS transistor, in said edges of the pattern of the active region.

2. The semiconductor device according to claim 1, wherein a portion of the semiconductor substrate at a side wall of said trench is not covered with isolation film to form an exposed trench portion, and said gate electrode wiring is formed on said exposed trench portion.

3. The semiconductor device according to claim 1, wherein said element formation region has a formation region in which a stacked capacitor is formed, the stacked capacitor including a capacitor electrode connected to one of the source diffusion layer and the drain diffusion layer of the MOS transistor.

4. The semiconductor device according to claim 3, wherein the other of said source diffusion layer and the drain diffusion layer not connected to the capacitor electrode is connected to a bit line and has a space larger than said one of the source diffusion layer and the drain diffusion layer connected to the capacitor electrode, when viewed from a top of the semiconductor substrate.

5. The semiconductor device according to claim 1, wherein the gate electrode wiring crosses the active region so that said edges extend between said source diffusion layer and said drain diffusion layer of the MOS transistor.

6. A semiconductor device comprising:
    an element isolation region having a trench formed in a surface region of a semiconductor substrate, and in which an isolation film is formed;
    a gate electrode wiring; and
    element forming regions formed in the surface region of the semiconductor substrate, isolated from each other by said element isolation region, the element formation regions each having an active region of a MOS transistor on which said gate electrode wiring is provided, the active region having a trapezoid pattern at a portion thereof where the active region overlaps with the gate electrode wiring such that both sides of the trapezoid pattern extend outwardly towards the center of the active region, so that the active region has a current path longer than a shortest distance between a source diffusion layer and a drain diffusion layer of the MOS transistor, in said edges of the trapezoid pattern of the active region.

7. The semiconductor device according to claim 6, wherein a portion of the semiconductor substrate at a side wall of said trench is not covered with isolation film to form an exposed trench portion, and said gate electrode wiring is formed on said exposed trench portion.

8. The semiconductor device according to claim 6, wherein said element formation region has a formation region in which a stacked capacitor is formed, the stacked capacitor including a capacitor electrode connected to one of the source diffusion layer and the drain diffusion layer of the MOS transistor.

9. The semiconductor device according to claim 8, wherein the other of said source diffusion layer and the drain diffusion layer not connected to the capacitor electrode is connected to a bit line and has a space larger than said one of the source diffusion layer and the drain diffusion layer connected to the capacitor electrode, when viewed from a top of the semiconductor substrate.

10. The semiconductor device according to claim 6, wherein the gate electrode wiring crosses the active region so that said edges extend between said source diffusion layer and said drain diffusion layer of the MOS transistor.

11. A semiconductor device comprising:

an element isolation region having a trench formed in a surface region of a semiconductor substrate, and in which an isolation film is formed;

a gate electrode wiring; and element forming regions isolated from each other by said element isolation region, the element formation regions each having an active region of a MOS transistor on which said gate electrode wiring is provided, the active region having a pattern, at a portion thereof where the active region overlaps with the gate electrode wiring, both edges of which pattern are a circular arc shape, so that the active region has a current path longer than a shortest distance between a source diffusion layer and a drain diffusion layer of the MOS transistor, in each of said edges of the pattern of the active region.

12. The semiconductor device according to claim 11, wherein a portion of the semiconductor substrate at a side wall of said trench is not covered with isolation film to form an exposed trench portion, and said gate electrode wiring is formed on said exposed trench portion.

13. The semiconductor device according to claim 11, wherein said element formation region has a formation region in which a stacked capacitor is formed, the stacked capacitor including a capacitor electrode connected to one of the source diffusion layer and the drain diffusion layer of the MOS transistor.

14. The semiconductor device according to claim 13, wherein the other of said source diffusion layer and the drain diffusion layer not connected to the capacitor electrode is connected to a bit line and has a space larger than said one of the source diffusion layer and the drain diffusion layer connected to the capacitor electrode, when viewed from a top of the semiconductor substrate.

15. The semiconductor device according to claim 11, wherein the gate electrode wiring crosses the active region so that said edges extend between said source diffusion layer and said drain diffusion layer of the MOS transistor.

* * * * *